(12) United States Patent
Limbeck et al.

(10) Patent No.: US 9,048,382 B2
(45) Date of Patent: Jun. 2, 2015

(54) THERMOELECTRIC GENERATOR, METHOD FOR PRODUCING A THERMOELECTRIC MATERIAL, MOTOR VEHICLE AND METHOD FOR PRODUCING A THERMOELECTRIC GENERATOR

(75) Inventors: Sigrid Limbeck, Much (DE); Rolf Brück, Bergisch Gladbach (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 439 days.

(21) Appl. No.: 13/348,827

(22) Filed: Jan. 12, 2012

(65) Prior Publication Data
US 2012/0177864 A1 Jul. 12, 2012

(30) Foreign Application Priority Data
Jan. 12, 2011 (DE) .......................... 10 2011 008 377

(51) Int. Cl.
*B32B 5/08* (2006.01)
*H01L 35/26* (2006.01)

(52) U.S. Cl.
CPC ..................................... *H01L 35/26* (2013.01)

(58) Field of Classification Search
CPC .... H01L 35/26; Y01T 428/218; Y01T 428/24
USPC .................. 428/66, 64.1; 136/208
See application file for complete search history.

(56) References Cited

U.S. PATENT DOCUMENTS

| 3,546,026 | A | 12/1970 | Beauchamp et al. |
| 2005/0126138 | A1* | 6/2005 | Anderson et al. ............... 55/498 |
| 2005/0155712 | A1* | 7/2005 | Chan et al. ..................... 156/351 |
| 2009/0011198 | A1* | 1/2009 | Sekiya et al. .................. 428/194 |
| 2010/0205920 | A1 | 8/2010 | Czubarow et al. |
| 2011/0120516 | A1 | 5/2011 | Laudo |

FOREIGN PATENT DOCUMENTS

| JP | 2004087714 A | 3/2004 |
| JP | 2004214244 A | 7/2004 |
| JP | 2005197385 A | 7/2005 |
| JP | 2005223237 A | 8/2005 |
| JP | 2007035857 A | 2/2007 |
| WO | 2009029393 A2 | 3/2009 |

* cited by examiner

*Primary Examiner* — Brent O'Hern
(74) *Attorney, Agent, or Firm* — Laurence A. Greenberg; Werner H. Stemer; Ralph E. Locher

(57) ABSTRACT

A thermoelectric material contains fibers and a method for producing a thermoelectric material uses fibers. The fibers, in this case, in particular, perform the function of influencing thermal conductivity, electrical conductivity, tensile strength and/or extensibility of the thermoelectric material. The thermoelectric material is used, in particular, in thermoelectric generators which are used, for example, in motor vehicles for converting thermal energy from the exhaust gas into electrical energy.

14 Claims, 3 Drawing Sheets

THERMOELECTRIC GENERATOR, METHOD FOR PRODUCING A THERMOELECTRIC MATERIAL, MOTOR VEHICLE AND METHOD FOR PRODUCING A THERMOELECTRIC GENERATOR

CROSS-REFERENCE TO RELATED APPLICATION

This application claims the priority, under 35 U.S.C. §119, of German Patent Application DE 10 2011 008 377.4, filed Jan. 12, 2011; the prior application is herewith incorporated by reference in its entirety.

BACKGROUND OF THE INVENTION

Field of the Invention

The present invention is directed to a thermoelectric material and to a method for producing such a thermoelectric material. The thermoelectric material is used, in particular, for thermoelectric elements which can be used in thermoelectric modules or thermoelectric generators. Such thermoelectric generators are preferably used in motor vehicles for converting thermal energy into electrical energy.

The exhaust gas from an internal combustion engine of a motor vehicle has thermal energy which can be converted into electrical energy through the use of a thermoelectric generator, for example in order to fill a battery or another energy storage device and/or to supply the required energy directly to electrical loads. The motor vehicle is thus operated with improved energy efficiency and energy is available to a greater extent for operation of the motor vehicle.

Such a thermoelectric generator has at least one thermoelectric module. Thermoelectric modules include, for example, at least two semiconductor elements (p-doped and n-doped) which are provided alternately on their upper and lower sides (towards the respective hot side and cold side) with electrically conductive bridges and which form the smallest thermoelectric unit or a thermoelectric element. The nature of thermoelectric materials is such that they can convert thermal energy into electric energy effectively (Seebeck effect), and vice versa (Peltier effect). If a temperature drop is provided on the two sides of the semiconductor elements, a voltage potential is formed between the ends of the semiconductor elements. The charge carriers on the hotter side are excited to an increased extent into the conduction band due to the higher temperature. Due to the difference in concentration produced thereby in the conduction band, charge carriers diffuse on the colder side of the semiconductor element, as a result of which the potential difference is produced. In a thermoelectric module, numerous semiconductor elements are preferably connected electrically in series. In order to ensure that the generated potential differences in the series-connected semiconductor elements do not cancel one another out, semiconductor elements with different majority charge carriers (n-doped and p-doped) are alternately always brought into direct electrical contact. The circuit can be closed through the use of a connected load resistance and thus electrical power can be tapped off.

In order to ensure permanent usability of the semiconductor elements, a diffusion barrier is generally disposed between the electrically conductive bridges and the thermoelectric material. The diffusion barrier prevents material contained in the electrical bridges or in the solder from diffusing into the thermoelectric material. That also prevents a loss of effectiveness or functional failure of the semiconductor material or the thermoelectric element.

The thermoelectric modules or the semiconductor elements are generally constructed by assembling individual components: thermoelectric material, diffusion barrier, electrically conductive bridges, insulation and possibly other housing elements. A hot or cold medium is allowed to flow over the thermoelectric module. That assembly of numerous individual components also requires that the individual component tolerances are matched precisely to one another and that the heat transfers from the hot side to the cold side are taken into consideration, and also that there is sufficient contact between the electrically conductive bridges, with the result that a current flow through the thermoelectric module can be produced.

In the configuration of such semiconductor elements in a thermoelectric module, regular housings, walls and/or support tubes for delimiting the module externally are provided, with the semiconductor elements being fastened between those elements. That results, in particular, in stringent specifications with regard to tolerances being provided during manufacture in order to realize a configuration of the semiconductor elements with respect to the electrical connections and the position of the housings with a precise fit. A further problem is that, as a result of the different thermal loads on the outer and inner housing parts in tubular thermoelectric modules, different expansion behaviors of those components also need to be taken into consideration. In that case, high stresses occur within the thermoelectric material which can result in failure of the thermoelectric material and therefore of the thermoelectric module. In particular, against the background that the individual thermoelectric elements are normally connected electrically in series, the failure of even one thermoelectric element is equivalent to total failure of a thermoelectric module. Precisely with respect to tubular thermoelectric modules with thermoelectric elements in the form of a ring or a segment of a ring, it is desirable for it to be possible to ensure sufficient fatigue strength even in the case of severe temperature gradients and correspondingly different expansion behavior not only of the thermoelectric material but also of other components of the thermoelectric module.

SUMMARY OF THE INVENTION

It is accordingly an object of the invention to provide a thermoelectric material and a method for producing a thermoelectric material, which overcome the hereinafore-mentioned disadvantages and solve at least some of the outlined problems of the heretofore-known materials and methods of this general type. In particular, the intention is to specify a thermoelectric material which has fatigue strength for the desired use in tubular thermoelectric modules and at the same time has a high degree of efficiency in order to produce electrical energy from the thermal energy of an exhaust gas or another hot medium.

With the foregoing and other objects in view there is provided, in accordance with the invention, a thermoelectric material, comprising a first side, a second side disposed opposite the first side, and fibers contained in the thermoelectric material.

In particular, the first side or second side is associated with a hot side or a cold side in a thermoelectric module, with the result that a flow of heat flows through the thermoelectric material from the first side towards the second side (or vice versa).

In principle, the form of the thermoelectric material can be selected, for example, while taking into consideration integration into a thermoelectric module. The thermoelectric material can, in particular, be pressed and/or printed into various forms. Thus, the thermoelectric material can be provided in the form of a right parallelepiped, a block, a strip or the like.

In accordance with another preferred feature of the invention, the thermoelectric material is in the form of a ring or a segment of a ring, with the first side forming an inner circumferential surface of the thermoelectric material and the second side forming an outer circumferential surface of the thermoelectric material.

In accordance with a further feature of the invention, the thermoelectric material is correspondingly formed at least from semiconductor material and fibers. By virtue of the joint configuration of fibers and semiconductor material to form a thermoelectric material, in particular a (fiber) composite material is produced which has different material properties than its individual components.

In accordance with an added feature of the invention, the fibers which can be used include ceramic fibers, glass fibers, metal fibers and/or carbon fibers. In this case, the fibers in particular perform the function of influencing or adjusting a thermal conductivity, electrical conductivity, tensile strength and/or extensibility of the thermoelectric material.

Ceramic fibers are particularly preferred in this case. The ceramic fibers being used are, in particular, non-oxidic and/or oxidic ceramics. Oxidic ceramic fibers can be formed, in particular, with the following materials: aluminum oxide, zirconium oxide, titanium (IV) oxide, magnesium oxide, zinc oxide, aluminum titanate, barium titanate.

Due to the susceptibility to thermal shock stress, in this case the oxidic ceramic fibers are used, in particular, in the thermoelectric material in the region of the cold side. "In the region of the cold side" means, in particular, that these ceramic fibers form at least 80% by weight of the total proportion of these ceramic fibers disposed in the thermoelectric material, in a section of the thermoelectric material which is disposed on the cold side, with that section including at most a third of the distance from the first side to the second side of the thermoelectric material. Preferably, these oxidic ceramic fibers are disposed transversely to the flow of heat through the thermoelectric material, with the result that the ceramic fiber itself has, as far as possible, an identical temperature over its extent.

Non-oxidic ceramic fibers can be formed, in particular, with the following materials: silicon nitride, boron carbide, boron nitride, silicon carbide, aluminum nitride. The non-oxidic ceramic fibers generally have a higher thermal conductivity in comparison with oxidic ceramic fibers. In particular, therefore, these non-oxidic ceramic fibers can only be disposed in small proportions in the direction of the flow of heat within the thermoelectric material.

In particular, mixtures of these ceramics are used and are implemented in this case correspondingly as ceramic fibers.

In particular, the thermoelectric material is a sintered material, with the ceramic fibers already being contained in the thermoelectric material prior to sintering and, as a result of the sintering, being joined fixedly with the thermoelectric material. At least one of the following materials, possibly even mixed forms thereof, is preferably used as the semiconductor material for the thermoelectric material (with the preferred maximum use temperature in brackets):

n-type:

$Bi_2Te_3$ [approx. 250° C.]; PbTe [approx. 500° C.]; $Ba_{0.3}Co_{3.95}Ni_{0.05}Sb_{12}$ [approx. 600° C.]; $Ba_y(Co,Ni)_4Sb_{12}$ [approx. 600° C.]; $CoSb_3$ approx. 700° C.]; $Ba_8Ga_{16}Ge_{30}$ [approx. 850° C.]; $La_2Te_3$ [approx. 1100° C.]; SiGe [approx. 1000° C.]; $Mg_2(Si,Sn)$ [approx. 700° C.];

p-type:

$(Bi,Sb)_2TE_3$ [approx. 200° C.]; $Zn_4Sb_3$ [approx. 380° C.]; TAGS [approx. 600° C.]; PbTe [approx. 500° C.]; SnTe [approx. 600° C.]; $CeFe_4Sb_{12}$ [approx. 700° C.]; $Yb_{14}MnSb_{11}$ [approx. 1000° C.]; SiGe [approx. 1000° C.]; $Mg_2(Si,Sb)$ [approx. 600° C.].

Precisely in the case of a thermoelectric material in the form of a ring or a segment of a ring, to a certain degree stresses also result within the thermoelectric material due to the tubular configuration of the thermoelectric module in which the thermoelectric materials are disposed as thermoelectric elements. These stresses are brought about by the thermal expansion of an inner tube or an outer tube, for example, which is difficult to compensate for in tubular thermoelectric modules. This effect is intensified in addition by the fact that different temperatures may be present at different positions precisely on the outer circumferential surface, with the result that different thermal stresses can be induced in this case too. Since precisely thermoelectric materials in the form of a ring have a large outer circumferential surface or, even given a matched thickness, have at least a large extent, when viewed in the circumferential direction, they are particularly affected by these thermal stresses. In order to stabilize the thermoelectric material, it is therefore proposed to introduce ceramic fibers into the thermoelectric material, with the result that the thermoelectric material has comparatively higher tensile strength ($R_m$ in N/mm$^2$ [Newtons per square millimeter]) and/or a higher apparent yield point ($R_{p0.2}$ in N/mm$^2$) and therefore, in particular, improved resistance to thermal shocks.

In accordance with an added, particularly preferred, feature of the invention, at least 80% by weight of the fibers are disposed parallel to one another. In particular, these fibers are oriented in such a way that they extend substantially from the inner circumferential surface towards the outer circumferential surface, i.e. are oriented parallel to a radial direction. As a result of this orientation, the fibers do not represent a barrier for the charge carriers either, so that the thermoelectric material does not have reduced efficiency with regard to the generation of electrical energy as a result of the fibers.

In accordance with yet another feature of the invention, fibers are provided with a different orientation (alignment or position) within the thermoelectric material. In particular, the fibers have two different orientations, preferably three different orientations. In particular, at least 80% by weight of the fibers are aligned substantially parallel to a respective one of the different orientations. The fibers are disposed, in particular, with two or three different orientations in the thermoelectric material and at least 80% by weight of the fibers are aligned parallel to one of the orientations. In particular, these different orientations include an orientation in the radial direction, an orientation in the circumferential direction and an orientation in the direction of the thickness of the thermoelectric material.

In accordance with yet a further preferred feature of the thermoelectric material of the invention, at least 80% by weight of the fibers are aligned transversely to at least the first side or the second side. This means, in particular, that at least 80% by weight of the fibers extend in each case in the radial direction, starting from the inner circumferential surface or outer circumferential surface of a thermoelectric material in the form of a ring or a segment of a ring. Precisely in this case, provision is, in particular, made for fibers which are disposed in the radial direction, i.e. which are oriented in the direction of the connection from cold side to hot side, to have a lower electrical conductivity than the semiconductor material, with the result that the electrons are not conducted over the fibers, but move within the semiconductor material.

In accordance with yet an added feature of the invention, in particular, the fibers are provided for stabilizing the thermoelectric material. The (all of the) fibers preferably have an electrical conductivity [in amperes/(volt*meter)] which is lower than the electrical conductivity of the semiconductor material. In particular, this applies to at least 80% by weight of the fibers. Preferably, the electrical conductivity of the fibers is at most 50% and particularly preferably at most 20% and in particular at most 5% of the electrical conductivity of the semiconductor material in a temperature range of between 20° C. and 250° C. [degrees Celsius].

In accordance with yet an additional feature of the invention, in particular, the (specific) thermal conductivity of the (all of the) fibers is lower than that of the semiconductor material. In particular, this applies to at least 80% by weight of the fibers. The specific thermal conductivity [watts/(Kelvin*meter)] is the capacity of a material to transport thermal energy through the use of thermal conduction in the form of heat. Preferably, the thermal conductivity of the fibers is at most 50% and particularly preferably at most 20% and in particular at most 5% of the thermal conductivity of the semiconductor material in a temperature range of between 20° C. and 250° C. [degrees Celsius].

In accordance with again another feature of the thermoelectric material of the invention, the fibers are distributed non-uniformly in the thermoelectric material. This means in particular that, in the case of thermoelectric materials in the form of a ring or a segment of a ring, at least 50% by weight of the fibers are disposed in a region (in the radial direction of the thermoelectric material) which extends, starting from the outer circumferential surface, over a third of the distance between the first side and the second side of the thermoelectric material. In particular, the fibers are distributed non-uniformly exclusively in the radial direction, that is to say that the thermoelectric materials can be introduced without any possibility of confusion, in particular independently of their position, but merely predetermined by their geometric form.

In accordance with again a further, particularly advantageous, feature of the invention, the fibers are formed with at least one property differing from one another, with the property being one of the following: thermal conductivity (in watts per Kelvin [W/K]), electrical conductivity (in amperes per volt*meter [W/(V*m]), tensile strength (see above) and extensibility (change in length of a tensile sample to breakage), apparent yield point (see above), elongation at break (remaining extension of a tensile sample after breakage, based on the initial length of the tensile sample). In particular, the fibers with different properties from one another need to be disposed, in identical or different proportions, in a common orientation. However, it is also possible to influence properties of the thermoelectric material in a targeted manner by virtue of fibers with respectively identical properties having identical orientations and correspondingly fibers with different properties being disposed in a different orientation in the thermoelectric material.

In accordance with again an added advantageous feature of the invention, the fibers are joined to the thermoelectric material at least through the use of a form-locking connection or adhesion. A form-locking connection in this case is understood to mean that one of the connection partners is in the way of the other. The form-locking connection is introduced, in particular, by virtue of the fibers not being entirely straight, but being at least partially curved or having different deviations in form. In particular, the fibers have a surface with a mean roughness Rz of at least 0.5 µm, with the result that an improved linkage is achieved between the thermoelectric material and the fibers.

In accordance with again an additional feature of the invention, the fibers are also joined with the semiconductor material in a force-locking manner and in particular also in a cohesive manner. In this case, force-locking means in particular that displacement of the connection partners (fiber, semiconductor material) with respect to one another is prevented as long as a counterforce brought about by static friction is not exceeded. In this case, cohesive means that the connection partners are held together by atomic or molecular forces.

In accordance with still another advantageous feature of the invention, the fibers together have a proportion of at most 70% by weight, measured against the total weight of the thermoelectric material. In particular, the fibers have a proportion of at least 30% by weight against or compared to a total weight of the thermoelectric material. Due to this high proportion of fibers (with a lower electrical conductivity than the semiconductor material), firstly the property of the thermoelectric material with regard to the energy conversion is not substantially impaired, but at the same time thermal insulation between a hot side and a cold side of a thermoelectric module (by fibers with a lower thermal conductivity than the semiconductor material) is improved. The mechanical properties of the thermoelectric material are markedly improved.

In accordance with still a further feature of the invention, the fibers have a proportion of at most 30% by weight, particularly preferably a proportion of at most 5% by weight, measured against or compared to the total weight of the thermoelectric material. Even by virtue of a lower fiber proportion (of at most 30% by weight), the mechanical properties can be markedly improved, with the result that the thermoelectric material has a higher fatigue strength, for example.

In accordance with still an added advantageous feature of the invention, the fibers at least partially have a coating. The coating has, in particular, whiskers which extend substantially transversely to the extent of the fibers towards the thermoelectric material. Due to these whiskers, improved adhesion and/or a form-locking connection is also achieved between the thermoelectric material and the fiber. Furthermore, however, the coating can also be an electrically insulating coating, for example, with the result that electrically conductive fibers can also be used within the thermoelectric material, also in a radial direction.

With the objects of the invention in view, there is concomitantly provided a method for producing a thermoelectric material. The method comprises:
a) providing a pulverulent semiconductor material;
b) providing fibers;
c) mixing or arranging the fibers together with the semiconductor material to form a starting material; and
d) compressing the starting material.

In particular, a thermoelectric material according to the invention with fibers is thus produced. The starting material is compressed, in particular, under excess pressure and at the same time at a temperature of at least 250° C. By virtue of this method, the thermoelectric material is sintered, with the result that a particularly dense material mixture can be produced and the fibers are disposed as firmly as possible within the thermoelectric material. The excess pressure in this case is between 0 and 100 megapascals (MPa), preferably less than 1 MPa, particularly preferably less than 0.5 MPa.

In accordance with a particularly advantageous mode, the fibers which are provided have been at least partially coated in advance. This applies particularly to the case in which ceramic fibers are used.

Reference is made in this case to the fact that the configurations described in connection with the thermoelectric material apply equally to the method according to the invention, and vice versa.

The invention is used, in particular, in a motor vehicle having an internal combustion engine with an exhaust gas system, in which a thermoelectric generator is provided that interacts with the exhaust gas system in such a way that it takes up thermal energy from the exhaust gas (indirectly or directly) and converts this thermal energy into electrical energy through the use of a thermoelectric material of the type according to the invention, or produced in accordance with the above-described method. In this connection, particular reference is also made to the explanations relating to FIG. 8.

Other features which are considered as characteristic for the invention are set forth in the appended claims, noting that the features mentioned specifically in the claims can be combined with one another in any desired technologically sensible manner and reveal further configurations of the invention.

Although the invention is illustrated and described herein as embodied in a thermoelectric material and a method for producing a thermoelectric material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
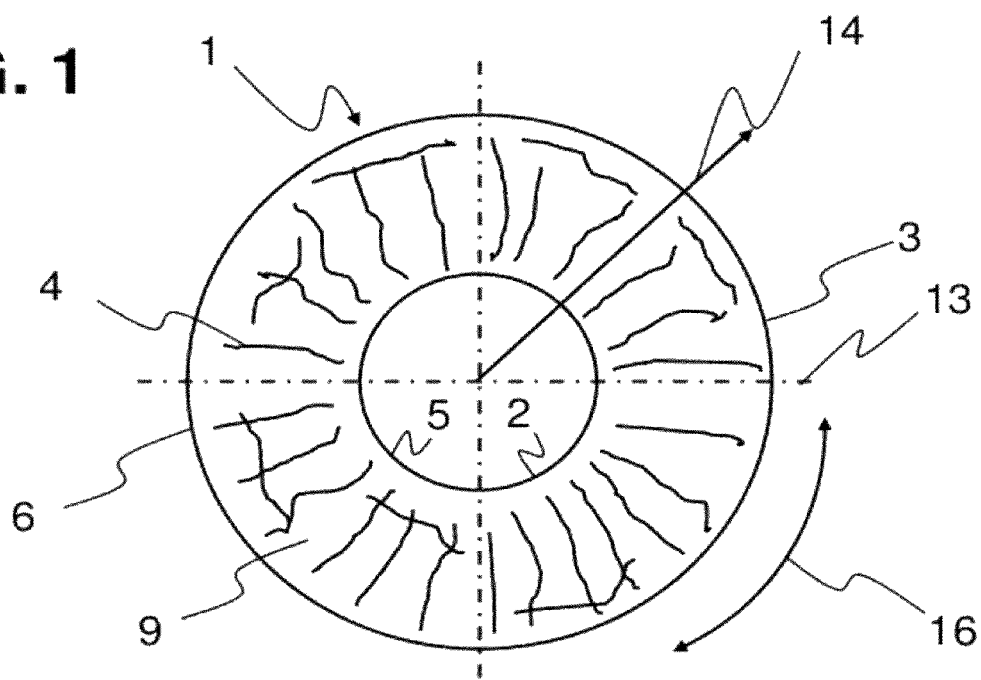
FIG. 1 is a diagrammatic, cross-sectional view of a thermoelectric material in the form of a ring.

Referring now in detail to the figures of the drawing for explaining the invention and the technical field in more detail by showing particularly preferred structural variants to which the invention is not restricted, and first, particularly, to FIG. 1 thereof, there is seen a cross-sectional view of a thermoelectric material 1 shown from the top in the form of a ring. The thermoelectric material 1 in the form of a ring is illustrated in a sectional illustration, so that fibers 4 in the interior of the thermoelectric material 1 can be illustrated. The thermoelectric material 1 has an inner circumferential surface 5 as a first side 2 and an oppositely-disposed outer circumferential surface 6 as second side 3. The fibers 4 which are shown extend substantially in radial direction 14 from the inner circumferential surface 5 towards the outer circumferential surface 6. Since the fibers 4 do not need to have a linear or extended extent, it should be clarified herein once again that a configuration of the fibers 4 according to the invention always has a slight inaccuracy. Individual fibers 4 in this case are also disposed in the circumferential direction 16. The fibers 4 are disposed within a semiconductor material 9 and are joined to the semiconductor material 9 in a form-locking manner and/or through the use of adhesion. In this case, form-locking means that one of the connection partners (fiber 4, semiconductor material 9) is in the way of the respective other connection partner. In this case, as a result of the production process, a force-locking and/or cohesive or material connection can also (additionally) be produced between the fiber 4 and the semiconductor material 9. In this case, force-locking means that displacement of the connection partners, fiber 4 and semiconductor material 9, with respect to one another is prevented as long as a counterforce brought about by static friction is not exceeded. In this case, cohesive means that the connection partners (fiber 4 and semiconductor material 9) are held together by atomic or molecular forces. This means that non-detachable connections are made which can only be separated by destroying the connection measures. This can be produced, in particular, by virtue of the semiconductor material 9 and the fibers 4 being at least partially joined to one another, for example as a result of diffusion, due to a sintering or hot-sintering process, with the result that a cohesive connection is at least partially realized.

In this case, the thermoelectric material 1 is illustrated only in the form of a ring. Express reference is made to the fact that the exemplary embodiments can also be transferred correspondingly to thermoelectric materials 1 in the form of a segment of a ring or in the form of a right parallelepiped.

Figure 2:
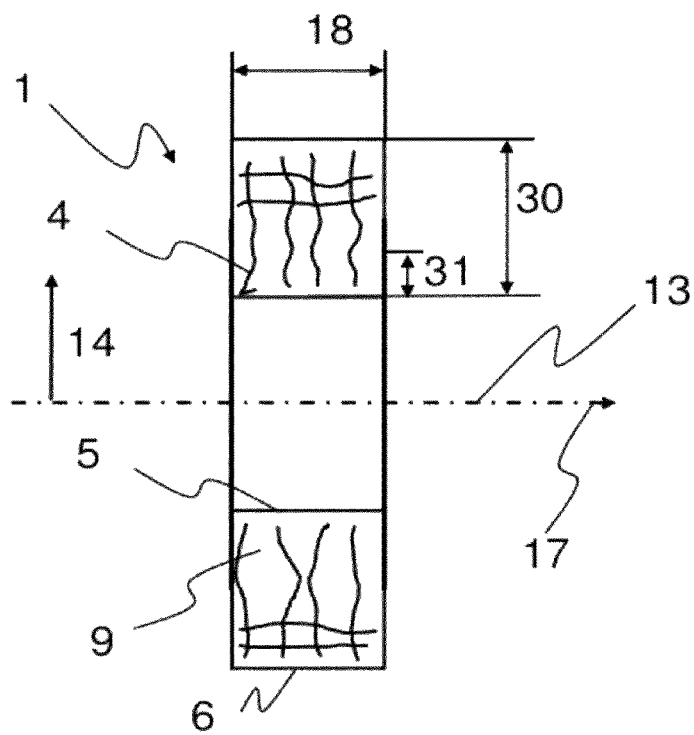
FIG. 2 is a longitudinal-sectional view of the thermoelectric material shown in FIG. 1.

FIG. 2 shows the thermoelectric material 1 seen in FIG. 1 from the side, with the thermoelectric material 1 being illustrated in a longitudinal-sectional view. The thermoelectric material 1 extends in axial direction 17 over a thickness 18. The thermoelectric material 1 is formed by the semiconductor material 9 and the fibers 4, which extend in this case substantially in the radial direction 14 from the inner circumferential surface 5 towards the outer circumferential surface 6. Further fibers 4 extend in the axial direction 17. The inner circumferential surface 5 and the outer circumferential surface 6 are disposed at a distance 30 from one another. A section 31 of the distance 30 extends in the circumferential direction 16 around the inner circumferential surface 5.

Figure 3:
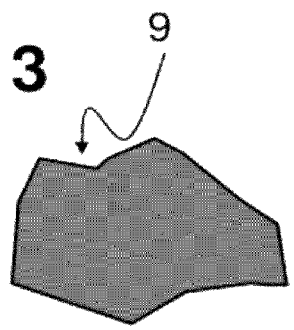
FIG. 3 is a plan view illustrating the provision of a pulverulent semiconductor material in method step a)

FIG. 3 illustrates the method step a) of the method according to the invention, in which a pulverulent semiconductor material 9 is provided.

Figure 4:
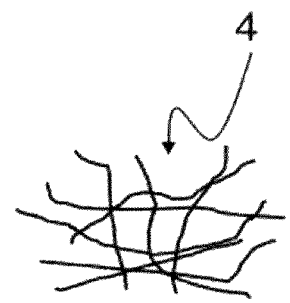
FIG. 4 is a plan view illustrating the provision of the fibers in method step b)

FIG. 4 illustrates the method step b) of the method according to the invention, in which fibers 4 are provided, separately or correspondingly mixed, as appropriate, with regard to their properties.

Figure 5:
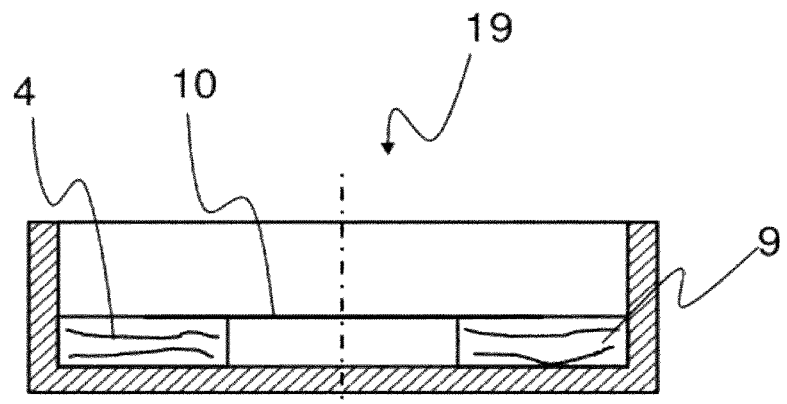
FIG. 5 is a cross-sectional view of a mold illustrating mixing or arranging of the fibers together with the semiconductor material to form a starting material in method step c)

FIG. 5 illustrates the method step c) of the method according to the invention, in which the fibers 4 are mixed and/or disposed together with the semiconductor material 9 to form a starting material 10. In this case, the specific alignment of the individual fibers 4 is already performed. The starting material 10 is disposed in a mold 19.

Figure 6:
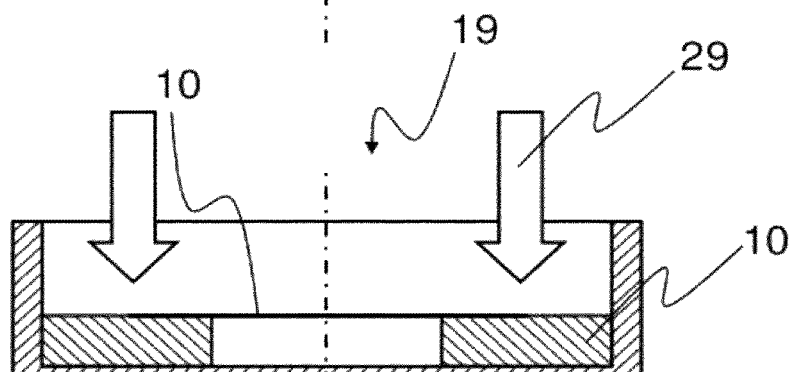
FIG. 6 is a cross-sectional view of the mold illustrating compressing of the starting material in method step d)

FIG. 6 shows method step d) of the method according to the invention, in which the starting material 10 is compressed in the mold 19 by application of a pressure 29. This compression results, in particular, in a sintering process, with this taking place, in particular, at the same time at an elevated temperature of at least 250° C., with the result that a hot-sintering process is performed.

Figure 7:
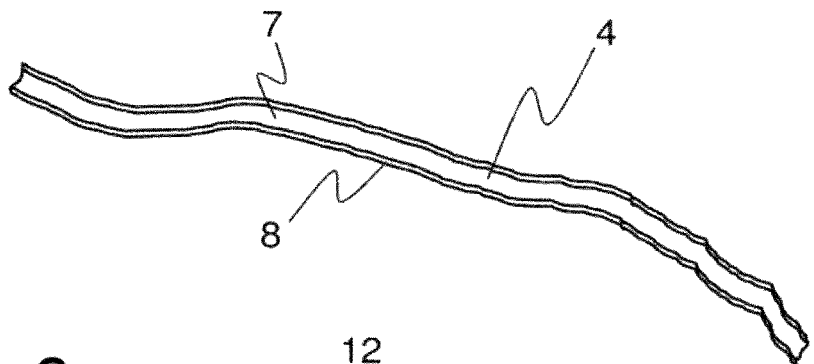
FIG. 7 is a plan view of a coated ceramic fiber.

FIG. 7 shows a fiber 4 which has, at least partially, a coating 8. The fiber 4 has a plurality of properties 7, with it being possible to distinguish between a plurality of fibers 4 with regard to at least one property 7. These properties 7 are thermal conductivity, electrical conductivity, tensile strength, extensibility, elongation at break, roughness and apparent yield point, for example.

Figure 8:
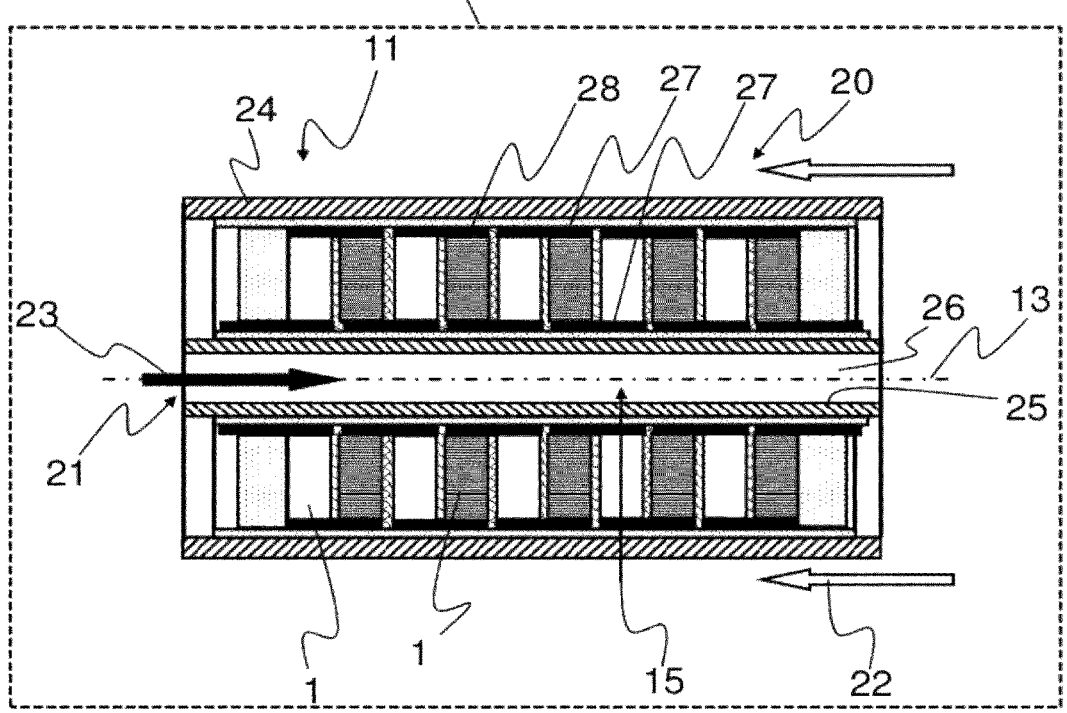
FIG. 8 is a plan view of a motor vehicle with a longitudinal-sectional view of a thermoelectric generator.

FIG. 8 diagrammatically shows a motor vehicle 12 with a thermoelectric generator 11. The thermoelectric generator 11 is tubular and has thermoelectric materials 1 in the form of rings between an outer tube 24 and an inner tube 25. The thermoelectric materials are electrically conductively connected to one another through electrically conductive bridges 27 alternately over their outer circumferential surface or inner circumferential surface. The thermoelectric generator 11 has a hot side 20 on its outer tube 24 and a cold side 21 on its inner tube 25. The cold side 21 is formed by a channel 26 within the inner tube 25, which extends along a mid-axis 13. In this case, a coolant 23 flows through the channel 26. An exhaust gas 22, or another hot medium, flows over the hot side 20. Correspondingly, a flow of heat 15 flows through the thermoelectric materials 1 from the hot side 20 towards the cold side 21. Furthermore, the thermoelectric generator 11 has electrical insulation 28 between the electrically conductive bridges 27 and the outer tube 24 and/or the inner tube 25. The hot side 20 can also be correspondingly disposed on the inner tube 25.

The invention claimed is:

1. A thermoelectric generator for converting thermal energy into electrical energy, the thermoelectric generator comprising:
at least one thermoelectric module having a hot side, a cold side and at least two semiconductor elements formed of thermoelectric material;
said thermoelectric material having a first side exposed to said cold side, a second side disposed opposite said first side and exposed to said hot side, and fibers contained in said thermoelectric material between said first and second sides, at least 80% by weight of said fibers being disposed parallel to one another;
said thermoelectric material producing electric energy upon a heat flow caused by a temperature difference between said hot and cold sides.

2. The thermoelectric generator according to claim wherein:
the thermoelectric material is in the form of a ring or a segment of a ring;
said first side forms an inner circumferential surface of the thermoelectric material; and
said second side forms an outer circumferential surface of the thermoelectric material.

3. The thermoelectric generator according to claim 1, wherein at least 80% by weight of said fibers are aligned transversely to at least one of said first side or said second side.

4. The thermoelectric generator according to claim 1, wherein said fibers are disposed in the thermoelectric material with two or three different orientations, and at least 80% by weight of said fibers are aligned parallel to one of said orientations.

5. The thermoelectric generator according to claim 1, wherein said fibers are distributed nonuniformly in the thermoelectric material.

6. The thermoelectric generator according to claim 1, wherein said fibers are formed with at least one property differing from one another, and said at least one property is thermal conductivity, electrical conductivity, tensile strength or extensibility.

7. The thermoelectric generator according to claim 1, wherein said fibers are joined to the thermoelectric material at least by a form-locking connection or adhesion.

8. The thermoelectric generator according to claim 1, wherein said fibers together have a proportion of at most 70% by weight, measured against a total weight of the thermoelectric material.

9. The thermoelectric generator according to claim 1, wherein said fibers at least partially have a coating.

10. The thermoelectric generator according to claim 1, which further comprises semiconductor material in which said fibers are disposed, said fibers having a lower electrical conductivity than said semiconductor material.

11. The thermoelectric generator according to claim 1, herein said fibers have a surface with a mean roughness Rz of at least 0.5 μm.

12. The thermoelectric generator according to claim 1, which further comprises semiconductor material in which said fibers are disposed, said fibers having a lower thermal conductivity than said semiconductor material.

13. A motor vehicle, comprising the thermoelectric generator according to claim 1.

14. A method for producing a thermoelectric generator for converting thermal energy into electrical energy, the method comprising the following steps:
providing at least one thermoelectric module having a hot side, a cold side and at least two semiconductor elements;
forming the at least two semiconductor elements of thermoelectric material producing electric energy upon a heat flow caused by a temperature difference between the hot and cold sides; and
producing the thermoelectric material by:
a) providing a pulverulent semiconductor material;
b) providing fibers;
c) mixing or arranging the fibers together with the semiconductor material to form a starting material with at least 80% by weight of the fibers disposed parallel to one another; and
d) compressing the starting material into the thermoelectric material.

* * * * *